United States Patent
Potocek et al.

(10) Patent No.: US 9,934,936 B2
(45) Date of Patent: Apr. 3, 2018

(54) CHARGED PARTICLE MICROSCOPE WITH SPECIAL APERTURE PLATE

(71) Applicant: FEI Company, Hillsboro, OR (US)

(72) Inventors: Pavel Potocek, Eindhoven (NL); Franciscus Martinus Henricus Maria van Laarhoven, Waalre (NL); Faysal Boughorbel, Eindhoven (NL); Remco Schoenmakers, Best (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/884,520

(22) Filed: Oct. 15, 2015

(65) Prior Publication Data
US 2016/0111247 A1    Apr. 21, 2016

(30) Foreign Application Priority Data
Oct. 16, 2014  (EP) .................................... 14189135

(51) Int. Cl.
*H01J 37/21* (2006.01)
*H01J 37/28* (2006.01)
*H01J 37/26* (2006.01)

(52) U.S. Cl.
CPC ............ *H01J 37/21* (2013.01); *H01J 37/263* (2013.01); *H01J 37/28* (2013.01);
(Continued)

(58) Field of Classification Search
CPC .. H01J 37/09; H01J 37/21; H01J 37/26; H01J 37/28; H01J 2237/0453; H01J 2237/0458;
(Continued)

(56) References Cited

U.S. PATENT DOCUMENTS

| 3,847,689 A | 11/1974 | Fletcher et al. |
| 7,253,417 B2 * | 8/2007 | Frosien ................. B82Y 10/00 250/306 |

(Continued)

FOREIGN PATENT DOCUMENTS

| EP | 1577926 | 9/2005 |
| JP | H07320674 | 12/1995 |

(Continued)

OTHER PUBLICATIONS

"Electron Microscope", Wikipedia, Accessed Oct. 15, 2015, 11 pages. <https://en.wikipedia.org/wiki/Electron_microscope>.
(Continued)

*Primary Examiner* — Wyatt Stoffa
(74) *Attorney, Agent, or Firm* — Scheinberg & Associates, P.C.; Michael O. Scheinberg; John B. Kelly

(57) ABSTRACT

A Charged Particle Microscope includes
- A specimen holder, for holding a specimen;
- A source, for producing a beam of charged particles;
- An illuminator, for directing said beam so as to irradiate the specimen; and
- A detector, for detecting a flux of radiation emanating from the specimen in response to said irradiation.

The illuminator includes:
- An aperture plate comprising an aperture region in a path of said beam, for defining a geometry of the beam prior to its impingement upon said specimen.

The aperture region includes a distribution of multiple holes, each of which is smaller than a diameter of the beam incident on the aperture plate.

20 Claims, 6 Drawing Sheets

(52) U.S. Cl.
CPC . *H01J 2237/0453* (2013.01); *H01J 2237/216* (2013.01); *H01J 2237/2802* (2013.01)

(58) Field of Classification Search
CPC ......... H01J 2237/216; H01J 2237/2802; H01J 37/263
See application file for complete search history.

(56) References Cited

U.S. PATENT DOCUMENTS

| | | | |
|---|---|---|---|
| 8,227,752 B1 | 7/2012 | Mantz et al. | |
| 8,907,280 B1* | 12/2014 | Larson | G01N 23/225 250/307 |
| 2003/0201393 A1* | 10/2003 | Tsuneta | H01J 37/26 250/311 |
| 2005/0098724 A1* | 5/2005 | Sullivan | H01J 37/28 250/310 |
| 2005/0194533 A1 | 9/2005 | Okuda et al. | |
| 2006/0255269 A1* | 11/2006 | Kawasaki | H01J 37/153 250/310 |
| 2009/0114818 A1* | 5/2009 | Casares | H01J 37/045 250/307 |
| 2010/0001203 A1* | 1/2010 | Nakayama | B82Y 10/00 250/397 |
| 2010/0294931 A1* | 11/2010 | Zarchin | H01J 37/244 250/310 |
| 2010/0320385 A1* | 12/2010 | Kitsuki | H01J 37/04 250/310 |
| 2011/0114838 A1* | 5/2011 | Han | G01B 15/00 250/307 |
| 2011/0139980 A1* | 6/2011 | Nakano | H01J 37/153 250/307 |
| 2013/0181140 A1* | 7/2013 | Parker | G21K 1/00 250/396 R |
| 2013/0187046 A1* | 7/2013 | Zeidler | B82Y 10/00 250/310 |
| 2014/0218710 A1* | 8/2014 | Choi | G03F 1/78 355/71 |
| 2015/0287568 A1* | 10/2015 | Rodgers | H01J 37/09 250/397 |
| 2016/0071696 A1* | 3/2016 | Kuiper | H01J 37/09 250/396 R |
| 2016/0111247 A1* | 4/2016 | Potocek | H01J 37/21 250/307 |
| 2016/0240344 A1* | 8/2016 | Kemen | H01J 37/045 |

FOREIGN PATENT DOCUMENTS

| | | |
|---|---|---|
| JP | 2007522654 A | 8/2007 |
| WO | 2012112894 | 8/2012 |

OTHER PUBLICATIONS

"Scanning Electron Microscope", Wikipedia, Accessed Oct. 15, 2015, 18 pages. <https://en.wikipedia.org/wiki/Scanning_electron_microscope>.

"Transmission Electron Microscopy", Wikipedia, Accessed Oct. 15, 2015, 23 pages. <https://en.wikipedia.org/wiki/Transmission_electron_microscopy>.

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Helium_Ion_Microscope>.

W. H. Escovitz et al., "Scanning Transmission Ion Microscope with a Field Ion Source", Proc. Nat. Acad. Sci. USA, vol. 72, No. 5, pp. 1826-1828, May 1975, 3 pages.

* cited by examiner

CHARGED PARTICLE MICROSCOPE WITH SPECIAL APERTURE PLATE

The invention relates to a Charged Particle Microscope, comprising:
- A specimen holder, for holding a specimen;
- A source, for producing a beam of charged particles;
- An illuminator, for directing said beam so as to irradiate the specimen;
- A detector, for detecting a flux of radiation emanating from the specimen in response to said irradiation, which illuminator comprises:
- An aperture plate comprising an aperture region in a path of said beam, for defining a geometry of the beam prior to its impingement upon said specimen.

The invention also relates to various innovative methods of using such a microscope.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
en.wikipedia.org/wiki/Electron_microscope
en.wikipedia.org/wiki/Scanning_electron_microscope
en.wikipedia.org/wiki/Transmission_electron_microscopy
en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

en.wikipedia.org/wiki/Scanning_Helium_Ion_Microscope

W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect the desired scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.

In particular, such an apparatus will typically further comprise:
- An aperture plate, located in the illuminator and positionable so as to intercept the beam of charged particles prior to their impingement on a specimen under investigation. This plate will generally comprise a sheet of material (such as metal) that is opaque to said beam but that comprises an aperture region that allows transmission of (at least part of) the beam. This plate is used to define/control a geometry (e.g. peripheral shape, size) of the beam prior to its impingement upon said specimen. The aperture region is tailored to have a footprint/cross-section that is entirely "filled" (permeated) by the incident charged-particle beam when the beam is centered thereon, e.g. by virtue of the fact that a diameter (extremal cross-sectional dimension) of said beam is at least as great as a diameter of said aperture region.

In what follows, the invention may—by way of example—sometimes be set forth in the specific context of electron microscopy. However, such simplification is intended solely for clarity/illustrative purposes, and should not be interpreted as limiting.

An example of a microscope as set forth in the opening paragraph above is a SEM, for instance. In this case, the abovementioned aperture plate is often referred to as a "condenser aperture" or "aberration control aperture", for example, and it conventionally has the function of limiting the extent/diameter/size of the beam cross-section; this is generally beneficial for image resolution, because charged particles that are more off-axis tend to be less well-focused on the specimen due to lens aberrations (such as spherical and chromatic aberration, for example) in the (probe-forming lens(es)) of the illuminator. For such purposes, the aperture region will basically consist of a relatively large round hole that is centered on the (particle-)optical axis. Typically, such a plate is positioned so as to lie proximal to the final probe-forming lens (objective lens) of the illuminator. Conventionally, the in-plane (Cartesian XY) position of the aperture region can be fine-tuned to exactly align it with the center of the probe-forming lens. Often, the microscope user can switch mechanically between a set of apertures of different sizes, in order to switch between different resolutions and probe currents.

Although a set-up such as that set forth in the previous paragraph has produced tolerable results up to now, the current inventors have worked extensively to substantially improve this conventional design. The results of this endeavor are the subject of the current application.

It is an object of the invention to provide an improved charged particle microscope as referred to above. In particular, it is an object of the invention that such a microscope should enjoy functionalities that have, to date, been lacking in conventional microscopes. Moreover, it is an object of the invention that the improved microscope design should be more versatile than prior-art apparatus, and that it should allow more accurate microscopy results to be obtained.

These and other objects are achieved in a charged particle microscope as set forth in the opening paragraph, characterized in that said aperture region comprises a distribution of a plurality of holes, each of which is smaller than a diameter of the beam incident on the aperture plate. Such an aperture region thus serves to convert a singular incident beam into a plurality of emergent sub-beams, the cross-sectional shape of a given sub-beam being dependent upon the shape of the hole (in said distribution) from which it emerges.

The crux of the current invention can be set forth in terms of mathematical considerations, and also in terms of physical considerations. As regards a general mathematical analysis, the following can be noted:

The process of image formation in a charged particle microscope involves a convolution of sample-related information and (particle-)optics-related information. The latter can, for example, be mathematically described using a so-called Point Spread Function (PSF), which sets forth the (functional) manner in which a point-like object is converted into a non-point-like image by intervening optics.

In order to extract only sample-related information or optics-related information from this convolution, some form of deconvolution will have to be performed. A convenient way of performing such deconvolution is in the Fourier domain, where one works with a quotient Q=S/O, whereby S is a frequency spectrum associated with the specimen and O is a frequency spectrum associated with the optics.

The inventors have observed that, when a conventional aperture plate is used—with its typical (large, single) round hole—the spectrum O tends to be quasi-Gaussian in nature, with multiple zeros. Since such zeros occur in the denominator of the quotient Q, they lead to discontinuities, and these manifest themselves as image-wide "artifacts", which can essentially be regarded as image noise.

On the other hand, when a multi-holed aperture plate according to the current invention is used, the spectrum O is observed to be much smoother, with fewer (or essentially no) zeros, thereby mitigating discontinuities of the type described above, and ultimately producing a much "cleaner" image, with improved signal-to-noise ratio.

Building upon this generic effect, one can also produce further, more specific refinements. In particular, the act of replacing a single (relatively large) hole by a distribution of multiple (significantly smaller) holes creates parameters/ extra degrees of freedom that can be "tuned" to produce specific effects. More specifically, such replacement creates new parameters such as distribution shape, distribution density, distribution isometry/symmetry, hole shape, hole size, hole orientation, etc., which can be chosen so as to produce specific manipulations of the spectrum O. As will be set forth in more detail below, such manipulations can lend themselves to significant functionality improvements, such as the following:

More rapid/accurate focus measurement/control;
Specimen height mapping;
Resolution improvement.

In addition to the mathematical elucidation given above, one can also understand (certain aspects of) the current invention in more physical terms. In this context, one can introduce the following assistive terminology:

A perfectly focused image of an aperture plate hole at the specimen plane can be referred to as comprising an umbra;

If said image is defocused, then its perimeter will become fuzzy, thus creating a penumbra that surrounds the umbra.

One can (informally) regard the umbra as containing zero-order imaging information, and the penumbra as containing first-order imaging information.

In a conventional microscope with a conventional, single-holed (round) aperture plate, there is a single (disc-shaped) umbra and a single (annular) penumbra. Replacing such an aperture plate by the inventive, multi-holed aperture plate produces multiple umbrae and penumbrae, with attendant higher-order phenomena associated with the overlap zones of neighboring penumbrae. This higher-order information is not present in the conventional situation. Not only does it give new/more information regarding the imaging process, but it can also be manipulated to (more closely) suit particular requirements, since altering the relative position, size and/or shape of the holes in the inventive aperture plate will correspondingly alter the size/nature of said overlap zones. In addition, the form and size of the collective non-overlapped penumbrae can be similarly manipulated, so that the first-order information also becomes potentially richer. Extraction of information from such higher-order overlap effects can be somewhat likened to extraction of information from interference fringes or wave beats, for example.

In a particular embodiment of the invention, the innovative aperture plate is used to perform an autofocus operation for the beam on the specimen. Conventionally, automatic focusing is enacted by performing a so-called "focus series", whereby a test series (train) of images of a test object (such as a particular feature of a specimen) is made through best focus, e.g. from slight over-focus, through best focus, to slight under-focus; analysis of this series then reveals the axial position of best focus as being the focal position of smallest image diameter of the employed test object. Such a dynamic approach, however, is time-consuming, and thus entails an undesirable throughput penalty. Moreover, since it entails a train of multiple exposures, it can be detrimental to radiation-sensitive test objects. The current invention circumvents this problem in two complimentary ways, as follows:

(i) By using a multi-holed aperture sec according to the invention, the inventors have found that a defocused image can be endowed with specific physical "fringe information"/mathematical "spectral information" that is uniquely indicative of the magnitude of defocus; in such a scenario, (mathematical) analysis of a single image can reveal the amount of defocus associated with that image. In order to determine the direction (sign) of defocus, a second image is made, at a slightly different focus setting, to determine whether defocus increases or decreases. In this scenario, the focus series of the prior art can thus be replaced by just a pair of successive images at slightly different focus values—thereby improving throughput, and decreasing total radiation exposure of the test object.

(ii) The approach in (i) can be further refined/improved if the distribution of holes in the inventive multi-holed aperture demonstrates non-isometry (asymmetry) relative to a barycenter thereof (e.g. by having different characteristics (such as shape, density, radial extent, hole size, etc.) for (certain) different orbital angular directions of a Polar coordinate system within the plane of the aperture plate). The inventors have observed that, in the case of such an asymmetric distribution, the abovementioned physical "fringe information"/mathematical "spectral information" can be rendered not only uniquely indicative of the magnitude of defocus, but also of the direction of defocus. In that case, a single image renders enough information to determine the position of best focus—thus replacing the dynamic focus series of the prior art by a much faster static method.

The skilled artisan will grasp that approaches (i) and/or (ii) can be used in conjunction with an associated (once-off or periodic) pre-calibration routine, which allows an observed degree of image defocus to be efficiently translated into a corresponding correction in axial focal position.

The autofocus functionality set forth in the previous embodiment is substantially advantageous in its own right, but it also admits new functionalities that were previously impractical. For example, in a particular embodiment of the invention, the innovative aperture plate is used during a scanning motion of the beam across at least a portion of the specimen to perform an operation selected from the group comprising:

Estimating a topographical profile for a surface of said portion impinged upon by the beam;

Producing an image of said portion that has an essentially uniform focus state for all points therein.

A significant advantage of the autofocus embodiment set forth in the previous paragraph is that it basically allows on-the-fly point-by-point focusing during a beam scan (since a time-consuming focus series is obviated). As a result, focus information per point (pixel/sector) of a scan path can be obtained in (substantially) real time, and this allows the following:

(a) One can note the axial position of best focus per point on the scan path, and reference these positions to a reference plane. In this way, one can construct a height map of the surface of (a portion of) the specimen that is impinged upon by the beam.

(b) Rather than using a single global focus value for an entire (portion of the) specimen, one can now adjust focus during a scan, allowing localized focusing to be achieved; in its ultimate form, this approach allows per-point focusing of a scanned image. This is not only useful for non-flat specimens, but is also advantageous in that it allows focus drift (e.g. due to thermal effects, hysteresis, vibration, etc.) to be compensated for.

In another embodiment of the present invention, the inventive aperture plate is used to improve resolution of an image of the specimen. Mathematically, it can be shown that an effect of using the inventive aperture plate is to modify a source function for the illuminator by superimposing thereupon a block function (filter function) that has a first value (e.g. 1) at locations corresponding to the holes in the aperture plate, and a second value (e.g. 0) at blocking locations of the aperture plate. In the case of a transmission-type CPM, modification of the source function in this way leads to an associated manipulation of the Contrast Transfer Function (CTF) that describes the ultimate imaging process in the CPM; in particular, the CTF can be manipulated so as to be augmented at higher spatial frequencies—where it would otherwise tend toward zero in the case of an unmodified source function. Such augmentation, in turn, leads to improved spatial resolution. See Embodiment 4 below, for example. In the case of a non-transmission-type CPM (such as a SEM, for example), an equivalent effect occurs in a mathematical function describing the probe profile/behavior at the specimen. Such a function may generically be referred to as an "imaging function".

In a particular version of an embodiment as described in the previous paragraph, the following applies:

Scanning motion of the beam is used to perform a sparse scan of the specimen;

Said image is constructed from detector data collected during said sparse scan. Sparse scanning is a technique whereby, instead of visiting all possible pixel positions along a specimen-filling scan path, one instead only visits a relatively sparse set of such positions. Such a scanning technique is advantageous in that it is necessarily (much) faster than a full scan, and entails much less radiation exposure of the specimen; however, it is, in principle, disadvantageous in that it produces a (much) smaller data set from which to construct an image, and this typically translates to lower image resolution. The mechanism explained in the previous paragraph provides a means of improving the attainable resolution, which is of particular importance to sparse-scanned imagery—giving either a better resolution for a given data set (often referred to as a "super-resolution" image), or allowing an even smaller (sparser) data set to be used to attain a given resolution. More information on (diverse) sparse scanning techniques in CPM imaging can, for example, be gleaned from European Patent Application EP 14172871.7.

In yet another embodiment of the present invention, the following applies.

The employed microscope is a transmission-type microscope, comprising an imaging system for directing a flux of charged particles transmitted through the specimen onto a detector;

The inventive aperture plate is used to measure image (de)focus.

This embodiment exploits the fact that the illuminating beam in a transmission-type microscope is not exactly collimated/parallel, but generally contains a (relatively narrow) distribution of illumination angles. Using the innovative aperture—which, for the current embodiment, is advantageously disposed in/proximal a beam cross-over, for example—this continuous distribution of illumination angles can be discretized into a collection of distinct illumination angle ranges—each of which is relatively narrow by virtue of the fact that it is formed as a result of passage through a relatively small hole. Consequently, a specimen illuminated in this way will be concurrently illuminated by plural distinct sub-beams, each with its own associated (median) beam tilt. For a defocused image, each of these sub-beams will produce its own laterally-shifted sub-image, with a lateral shift whose magnitude and sign depends on the magnitude and sign of the progenitor sub-beam's tilt; on the other hand, for a focused image, all such lateral shifts will essentially be zero. Concurrent illumination of the specimen by a plurality of such sub-beams will thus produce an associated plurality of individually laterally shifted sub-images, which combine to form a convoluted resultant image. Mathematical deconvolution of this image will then yield the magnitude and sign of the associated defocus. In this way, focus information can be gleaned from a single imaging session (using concurrent plural sub-beam tilts) rather than having to be determined using multiple imaging sessions (using a temporal sequence of individually adjusted beam tilts)—thus saving time, improving throughput, and reducing the cumulative radiation dose to the specimen.

As already indicated above, the invention offers considerable flexibility/freedom as regards the form given to the innovative aperture region. In addition to geometrical parameters of the distribution—such as the form of the "grid" on which nodes of the distribution are located (e.g. hexagonal, orthogonal, polar, irregular, etc.), the size of the "cells" in the grid, the filling factor of said cells, etc.—one can also (freely) choose parameters of the holes—such as hole size, hole shape, hole orientation, etc. By providing such multitudinous adjustable parameters, the present invention provides manifold extra degrees of freedom that are not available with a conventional aperture, and that can be tuned so as to finely manipulate the aforementioned PSF/Fourier spectrum/CTF/imaging function. To give more specific examples:

- Appropriate adjustment of the size (pitch/period) of the grid referred to above can be used to enhance/suppress certain (Fourier) frequencies in the image;
- Choosing a relatively fine grid pitch can be expected to yield more precise depth-related (focus) information than a relatively coarse grid pitch;
- Choosing a circular or quasi-circular (such as hexagonal) cell shape can be expected to yield better reconstruction results for non-specific specimen geometries (such as irregular biological cells, mineralogical grains, etc.), though an orthogonal grid may yield better results in the case of a specimen with an intrinsic orthogonal structure (such as a semiconductor circuit), for example;
- That having been said, one is not restricted to a regular grid/cell shape, and an irregular or quasi-regular distribution of holes is also permissible;
- As regards hole shape/size: the elucidation above/below makes it clear that adjusting these parameters will tune the form of the block function (filter function) that the inventive aperture plate superimposes upon an impinging source wave.

In a particular embodiment of the invention ("heterogeneous" embodiment), the distribution comprises at least two holes that are mutually different as regards at least one of hole size, hole shape, and hole orientation. Such an embodiment allows maximal flexibility in tailoring the (block/filter function of the) inventive aperture plate to the needs of a given situation.

As already set forth above, one is free to produce many different possible embodiments of the inventive aperture plate, by adjusting parameters of the hole distribution and/or of the holes themselves within the aperture region; in this way, one can alter the PSF associated with the aperture plate, can accentuate/suppress certain frequencies in the attendant Fourier spectrum, etc. To allow increased flexibility/diversity of use of the inventive CPM, it would be useful to be able to quickly/easily deploy different such aperture plates as desired/required. To this end, in a particular embodiment of the present invention, a given aperture plate is held by an exchanger mechanism that can be selectively invoked to place a variety of different such aperture plates in the beam path. Said variety of apertures plate may, if desired, contain conventional-type aperture plates in addition to various versions of the innovative type of aperture plate of the present invention. Having a variety of aperture plates in situ within the vacuum environment of the CPM is advantageous, since such plates do not have to be moved through airlocks before/after each use. Moreover, the CPM user can easily switch between different aperture plates as his needs change, e.g. if he starts to examine a different type of specimen, or conduct a different type of analysis (imaging, diffractogram capture, spectroscopy), or perform a calibration routine, etc.

In a refinement of the embodiment set forth in the previous paragraph, said exchanger mechanism is selected from the group comprising:

- A tray comprising a number of holder positions, each of which can be provided with an aperture plate, which tray can be moved so as to position different holder positions in said beam path;
- A gripper that cooperates with a library of aperture plates, the gripper capable of extracting a given aperture plate from said library and positioning it in said beam path.

As regards said tray, this may, for example, be a rotatable carrousel or a slidable sled, which can be driven/positioned by a motor (such as a stepper motor, for instance). As regards said gripper, this may, for example, be a SCARA robot or other type of mechanical arm/hand mechanism that cooperates with a rack/stack having slot positions in which various aperture plates are stored. If desired, such mechanisms can be fully automated, e.g. by noting in an electronic lookup table the storage positions of various types of aperture plate, and connecting the relevant actuator of the exchanger mechanism (carrousel/sled driver, robot arm, rack/stack elevator, etc.) to a computer controller that can consult said lookup table in response to an input on a user interface (such as selection of an icon on a (touch)screen, for example) and send appropriate control commands to said actuator so as to position a selected aperture plate in the beam path.

The invention will now be elucidated in more detail on the basis of exemplary embodiments and the accompanying schematic drawings, in which.

In the Figures, where pertinent, corresponding parts are indicated using corresponding reference symbols.

EMBODIMENT 1

Figure 1:
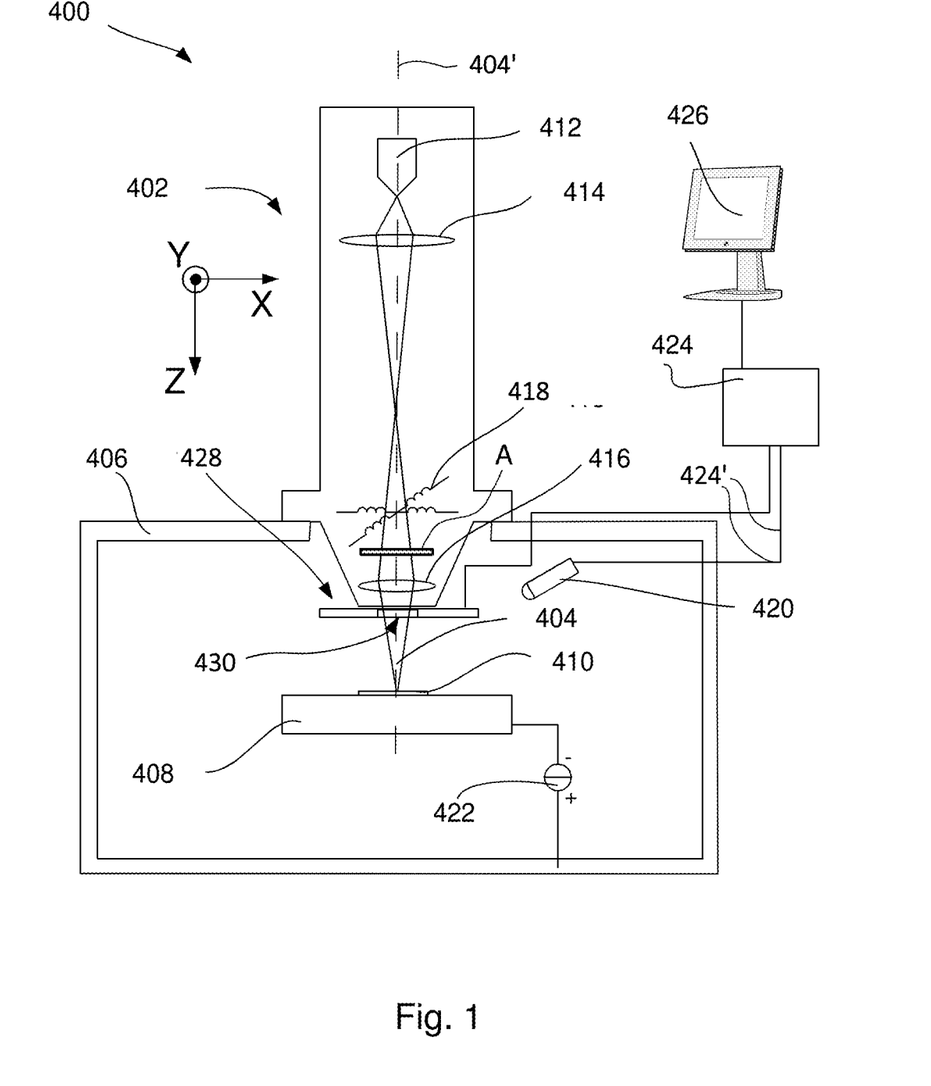
FIG. 1 renders a cross-sectional view of an embodiment of a scanning-type charged particle microscope according to the present invention.

FIG. 1 is a highly schematic depiction of an embodiment of a CPM according to the present invention; more specifically, it shows an embodiment of a scanning-type microscope 400, which, in this case, is a SEM (though, in the context of the current invention, it could just as validly be an ion-based microscope, for example). The microscope 400 comprises a particle-optical column 402, which produces a beam 404 of input charged particles (in this case, an electron beam) that propagates along a particle-optical axis 404'. The particle-optical column 402 is mounted on a vacuum chamber 406, which comprises a specimen holder/stage 408 for holding a specimen 410. The vacuum chamber 406 is evacuated using vacuum pumps (not depicted). With the aid of voltage source 422, the specimen holder 408, or at least the specimen 410, may, if desired, be biased (floated) to an electrical potential with respect to ground.

The particle-optical column 402 comprises an electron source 412 (such as a Schottky gun), lenses 414, 416 to focus the electron beam 404 onto the specimen 410, and a deflection unit 418 (to perform beam steering/scanning of the beam 404). The apparatus 400 further comprises a controller/computer processing apparatus 424 for controlling inter alia the deflection unit 418, lenses 414, 416 and detectors 420, 428 and displaying information gathered from the detectors 420, 428 on a display unit 426. In the current context, items 414, 416 and 418 may be regarded as being comprised in the illuminator referred to above.

The detectors 420, 428 are chosen from a variety of possible detector types that can be used to examine different types of output radiation flux emanating from the specimen 410 in response to irradiation by the input beam 404. In the apparatus depicted here, the following detector choices have been made:

Detector 420 is a boron-doped solid state detector that is used to detect (at least a portion of) a flux of output electrons emanating from the specimen 410;

Detector 428 is a segmented electron detector, comprising a plurality of independent detection segments (e.g. quadrants) disposed about a central aperture 430 (allowing passage of the beam 404). Such a detector can, for example, be used to investigate the angular dependence of a flux of output (secondary or backscattered) electrons emerging from the specimen 410.

As here rendered, both detectors 420 and 428 are used to examine electrons; however, this is purely a design/implementation choice and, if desired, one could also elect to detect other types of output radiation flux emanating from the specimen 410 (e.g. X-rays, cathodoluminescence) in addition, or as an alternative, to electrons.

By scanning the input beam 404 over the specimen 410, output radiation—comprising, for example, a flux of X-rays, infrared/visible/ultraviolet light, secondary electrons and or backscattered (BS) electrons—emanates from the specimen 410. Since such output radiation is position-sensitive (due to said scanning motion), the information obtained from the detectors 420, 428 will also be position-dependent. This fact allows the output of detector 420 to be used to produce (for example) a backscattered electron image of (part of) the specimen 410, which image is basically a map of an output of detector 420 as a function of scan-path position on the specimen 410.

The signals from the detectors 420, 428 pass along control lines (buses) 424', are processed by the controller 424, and displayed on display unit 426. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:

The use of dual beams—for example an electron beam 404 for imaging and an ion beam for machining (or, in some cases, imaging) the specimen 410;

The use of a controlled environment at the specimen 410—for example, maintaining a pressure of several mbar (as used in a so-called Environmental SEM) or by admitting gases, such as etching or precursor gases, etc. Although the scanning-type microscope shown in FIG. 1 is a SEM, it could, in the context of the current invention, just as validly be a STEM, for example (see Embodiment 3 below).

In accordance with (an embodiment of) the current invention, an aperture plate A of a type as hereabove set forth (e.g. as elucidated in Embodiment 2) is (removably/adjustably) mounted in the illuminator of the CPM 400; in this case, the aperture plate A is disposed proximal to the final lens element 416. Typically, the aperture plate A will be mounted on a holder (not depicted), which may be of an exchanger type as referred to above. When the beam 404 is on, it will pass through the multiple holes of the aperture region of the plate A (see respective items 54, 52 in FIGS. 2A, 2B, for example), and will be sub-divided into a plurality of sub-beams—thereby becoming "patterned" according to the particular distribution/properties of said holes. As set forth above/below, such patterning allows various useful mathematical/physical effects to be achieved.

EMBODIMENT 2

Figure 2A:
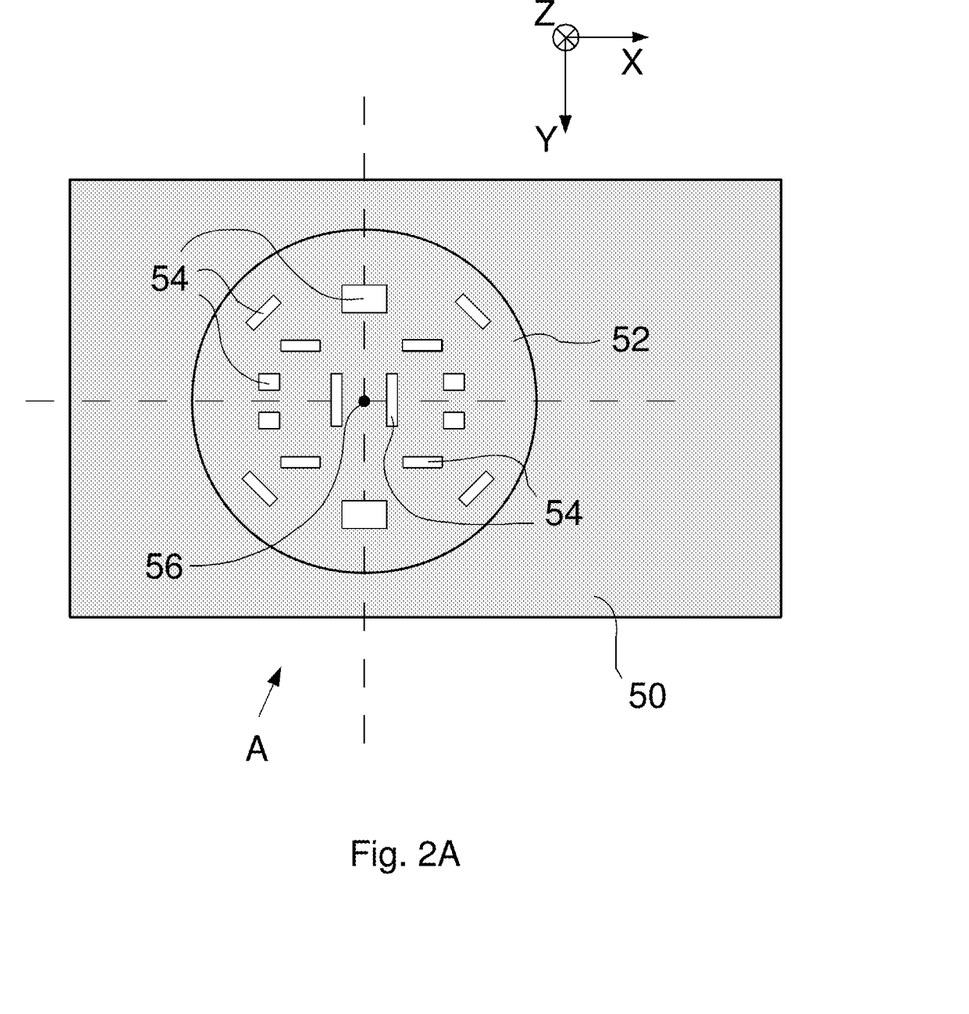
FIGS. 2A and 2B each render a plan view of an embodiment of an aperture plate according to the current invention.

FIG. 2A renders a plan view of a particular embodiment of an aperture plate A according to the current invention. The plate A is, for example, comprised of a metal sheet 50 (e.g. platinum or molybdenum), with a thickness of the order of about 0.1 mm and lateral dimensions (diameter) of the order of about 3 mm×3 mm, for instance. Within the area of the sheet 50 is an aperture region 52, corresponding to an intended footprint of the charged-particle beam that will impinge upon the plate A when it is in use; as here depicted, the aperture region 52 is circular, with a diameter of the order of about 0.1 mm, for example. Within the perimeter of region 52 is a distribution of a plurality of (relatively small) holes 54, which, in this case, are of various shapes, sizes and orientations; although the depicted holes 54 are rectangular, they could also have other forms, such as circular, triangular, hexagonal, etc. Note that, in the current instance, the distribution of holes 54 demonstrates non-isometry relative to the barycenter 56 of the distribution (also the center of the aperture region 52, as here depicted). The holes 54 will typically have a width of the order of about a few (tens of) microns.

Figure 2B:
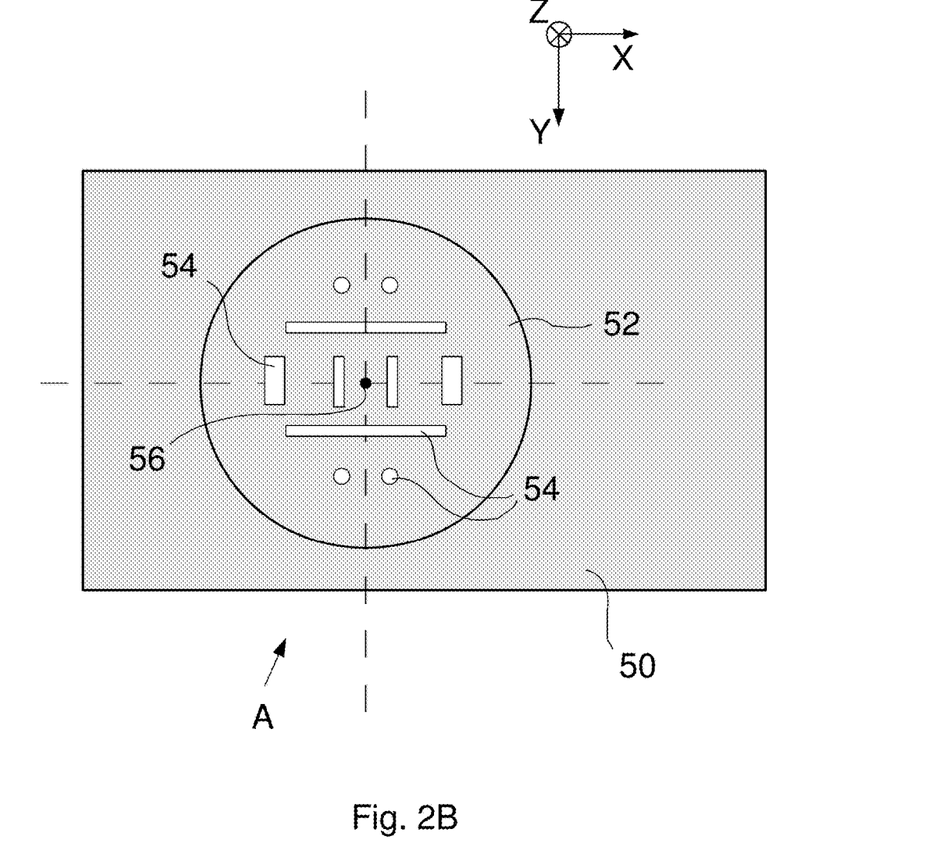
Figure 3:
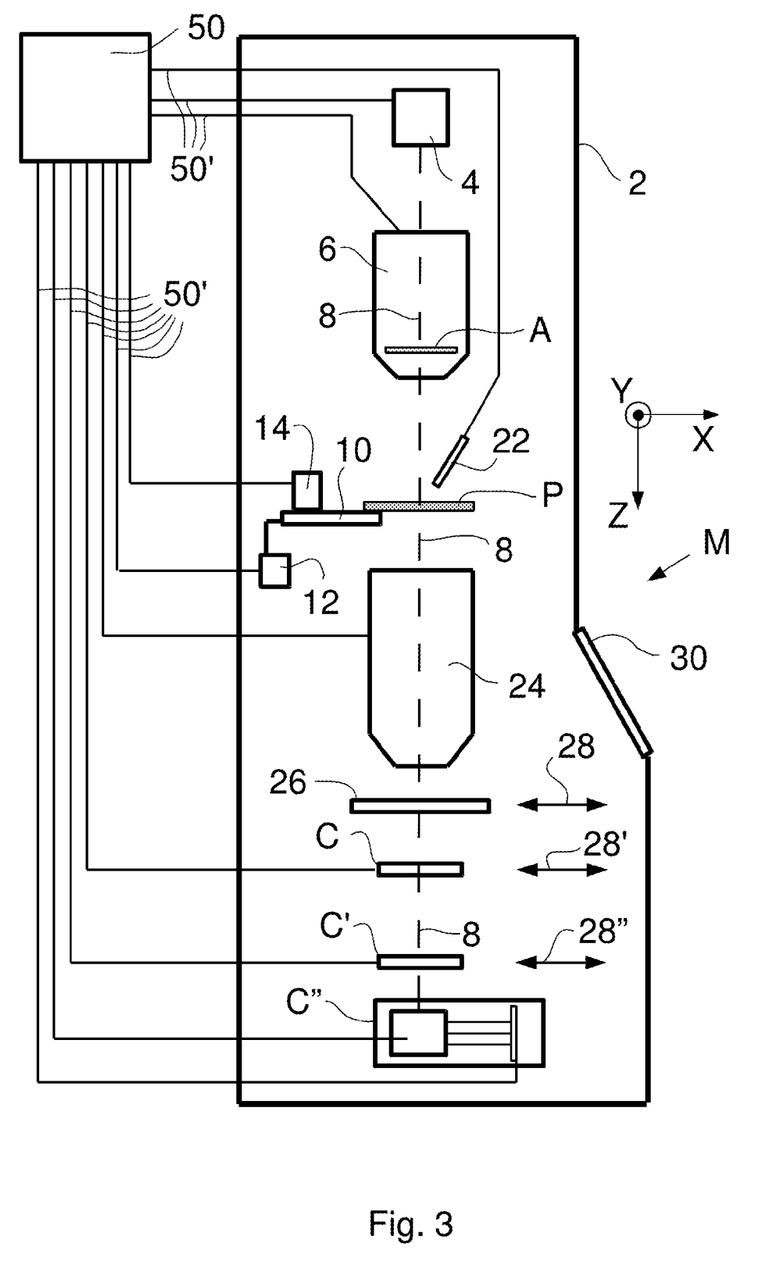
FIG. 3 renders a cross-sectional view of an embodiment of a transmission-type charged particle microscope according to the present invention.

When the aperture plate A is in use in a CPM, it is nominally positioned such that the point 56 (approximately) lies upon the particle-optical axis of the CPM's illuminator (e.g. axis 404' of FIG. 1, or axis 8 of FIG. 3). An incident particle beam propagating along said particle-optical axis will be selectively eclipsed by the plate A, with beam transmission only occurring through holes 54. In this way, aperture plate A acts as a "patterning plate" or spatial filter, and serves to subdivide an incident beam into a plurality of emergent sub-beams. As explained above and below, parameters such as the particular distribution of holes 54, and/or the sizes, shapes and orientations of the holes 54, can be chosen (essentially at will) so as to produce a desired overall pattern, with its attendant specific effect on entities such as the PSF and CTF associated with illumination through the plate A. To emphasize this aspect of the invention, FIG. 2B shows a variation of the subject of FIG. 2A that is also an admissible embodiment of the present invention.

EMBODIMENT 3

FIG. 3 is a highly schematic depiction of an embodiment of another CPM according to the current invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure 2, an electron source 4 (such as a Schottky gun, for example) produces a beam of electrons that traverse an electron-optical illuminator 6, serving to direct/focus them onto a chosen part of a specimen P (which may, for example, be (locally) thinned/planarized). This illuminator 6 has an electron-optical axis 8, and will generally comprise a variety of electrostatic/magnetic lenses, (scan) deflectors, correctors (such as stigmators), etc.; typically, it can also comprise a condenser system (the whole of item 6 is sometimes referred to as "a condenser system").

The specimen P is held on a specimen holder 10 that can be positioned in multiple degrees of freedom by a positioning device (stage) 12; for example, the specimen holder 10 may comprise a finger that can be moved (inter alia) in the XY plane (see the depicted Cartesian coordinate system; typically, motion parallel to Z and tilt about X/Y will also be possible). Such movement allows different parts of the specimen P to be irradiated/imaged/inspected by the electron beam traveling along axis 8 (in the Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The (focused) electron beam traveling along axis 8 will interact with the specimen P in such a manner as to cause various types of "stimulated" radiation to emanate from the specimen P, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen P, emerge (emanate) from it and continue to propagate (substantially, though generally with some deflection/scattering) along axis 8. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 28) so as to get it out of the way of axis 8. An image (or diffractogram) of (part of) the specimen P will be formed by imaging system 24 on screen 26, and this may be viewed through viewing port 30 located in a suitable part of the wall 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera C. At camera C, the electron flux can form a static image (or diffractogram) that can be processed by controller 50 and displayed on a display device (not depicted), such as a flat panel display, for example. When not required, camera C can be retracted/withdrawn (as schematically indicated by arrows 28') so as to get it out of the way of axis 8.

STEM detection device C'. An output from device C' can be recorded as a function of (X,Y) scanning beam position on the specimen P, and an image can be constructed that is a "map" of output from C' as a function of X,Y. Device C' can comprise a single pixel with a diameter of e.g. 20 mm, as opposed to the matrix of pixels characteristically present in camera C. Moreover, device C' will generally have a much higher acquisition rate (e.g. $10^6$ points per second) than camera C (e.g. $10^2$ images per second). Once again, when not required, device C' can be retracted/withdrawn (as schematically indicated by arrows 28") so as to get it out of the way of axis 8 (although such retraction would not be a necessity in the case of a donut-shaped annular dark field detection device C', for example; in such a device, a central hole would allow beam passage when the device was not in use).

As an alternative to imaging using camera C or device C', one can also invoke spectroscopic apparatus C''', which could be an EELS module, for example (EELS=Electron Energy-Loss Spectroscopy).

It should be noted that the order/location of items C, C' and C'' is not strict, and many possible variations are conceivable. For example, spectroscopic apparatus C'' can also be integrated into the imaging system 24.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis 8, taking the form of a small tube (e.g. of the order of 1 cm in diameter) through which the employed electron beam passes, but widening out to accommodate structures such as the source 4, specimen holder 10, screen 26, camera C, detection device C', spectroscopic apparatus C'', etc.

In accordance with (an embodiment of) the current invention, an aperture plate A of a type as hereabove set forth is (removably/adjustably) mounted in the illuminator 6 of the CPM M; in this case, the aperture plate A is disposed at/proximal a beam cross-over (not depicted) in the illuminator 6. Once again, the aperture plate A can, if so desired, be mounted on an exchanger-type holder (not depicted).

EMBODIMENT 4

The following elucidation gives a mathematical description of how an aperture plate according to the present invention can be used to augment the Contrast Transfer Function in a CPM, more specifically in a (S)TEM.

Probe Profile for SEM/STEM

Consider a probe forming microscope such as a SEM or STEM. Let $\Psi_0(G)$ describe the parallel wave incident on the objective lens (=final probe forming lens). G is the transverse position of the electron wave at the lens (which corresponds to the transverse momentum after the lens). If one neglects the (irrelevant) dependence on time and axial coordinate z (or axial momentum $G_z$), $\Psi_0(G)$ is a constant function inside the beam diameter. The diameter of the incident wave is taken into account by an aperture function A(G). Here A(G)=1 for $G<G_{max}$ and A(G)=0 for $G>G_{max}$, where $G_{max}$ represents the radius of the incident beam. Thus:

$$\Psi_0(G)=A(G)$$

The aberrations of the objective lens affect the incident wave according to the well-known phase aberration function:

$$\chi(G)=\tfrac{1}{2}\lambda FG^2+\tfrac{1}{4}\lambda^3 C_S G^4$$

where F is defocus and $C_S$ is spherical aberration (other aberrations are left out for simplicity), and $\lambda$ is the wavelength of the electron wave. The wave after the objective lens becomes:

$$\Psi(G)=\exp[2\pi i\chi(G)]\Psi_0(G)=\exp[2\pi i\chi(G)]A(G)$$

The profile of the probe at the specimen is the Fourier transform of $\Psi(G)$:

$$\Psi(x)=\int dG\exp[2\pi iGx]\Psi(G)=\int dG\exp[2\pi iGx]\exp[2\pi i\chi(G)]A(G)$$

If the inventive aperture is placed at or proximal the objective lens, then A(G) will be modified such that A(G) also equals 0 at the spatial frequencies blocked by the inventive aperture. When an appropriate choice is made for the distribution of holes in the inventive aperture (i.e. when a proper choice is used for the sub-regions where A(G) is zero) it is possible to create a $\Psi(x)$ which has sharper edges/features than a $\Psi(x)$ obtained with a conventional aperture (that is, with an A(G) that is only non-zero in one single area). Such sharper edges/features lead to better image resolution when the probe profile $\Psi(x)$ is properly deconvoluted from the SEM/STEM image.

Contrast Transfer Functions for TEM

Although the process of image formation in a TEM is more complex than in a SEM/STEM, the effect of the inventive aperture on TEM image formation can also be elucidated on the basis of a mathematical description comparable to that in the previous section (for SEM/STEM), as follows.

Consider a parallel electron wave $\Psi_0(v)=1$ passing a specimen, and neglect the (essentially irrelevant) dependence on time and axial coordinate z; here, two-dimensional position in the XY plane is denoted by vector v. The Fourier transform of $\Psi_0(v)$ is $\Psi_0(G)=\delta(G)$, where the two-dimensional spatial frequency is $G=v/|v|^2$. Consider the effect of some frequency component G in the specimen. Upon exiting the specimen, the small absorption $\epsilon(G)$ and the small phase shift $\varphi(G)$ caused by this frequency component will have modified the beam to:

$$\Psi(G)=\delta(G)-\epsilon(G)-i\varphi(G)$$

A subsequently traversed objective lens causes additional phase shifts due to defocus and aberrations, according to:

$$\Psi(G)=\delta(G)-[\epsilon(G)+i\varphi(G)]\exp[2\pi i\chi(G)]$$

where $\chi$ is (again) the well-known phase aberration function:

$$\chi(G)=\tfrac{1}{2}\lambda FG^2+\tfrac{1}{4}\lambda^3 C_S G^4$$

where F is defocus and $C_S$ is spherical aberration (other aberrations are left out for simplicity), and $\lambda$ is (again) the wavelength of the electron wave. The recorded intensity at an image detector is proportional to the convolution (*) of $\Psi$ with its complex conjugate:

$$\begin{aligned}I(G) &= \Psi^*(G)*\Psi(G)\\ &= \{\delta(G)-[\varepsilon(G)-i\varphi(G)]\exp[-2\pi i\chi(G)]\}*\\ &\quad\{\delta(G)-[\varepsilon(G)+i\varphi(G)]\exp[2\pi i\chi(G)]\}\\ &= \delta(G)-\varepsilon(G)\{\exp[-2\pi i\chi(G)]+\exp[2\pi i\chi(G)]\}+\\ &\quad i\varphi(G)\{\exp[-2\pi i\chi(G)]-\exp[2\pi i\chi(G)]\}+\ldots\\ &= 1-2\varepsilon(G)\cos[2\pi\chi(G)]-2\varphi(G)\sin[2\pi\chi(G)]+\ldots\end{aligned}$$

The triple dots (• • •) represent terms quadratic in $\epsilon$ and $\varphi$, which can be neglected. For obvious reasons, the factor cos $[2\pi\chi(G)]$ is called the Amplitude Contrast Transfer Function, and the factor sin $[2\pi\chi(G)]$ is called the Phase Contrast Transfer Function.

Spatial Coherence Damping Envelope The convergence of the beam is non-zero due to the finite size of the virtual source. One can take this into account by replacing the incoming beam $\Psi_0(G)=\delta(G)$ by a distribution P(G). Usually, P(G) is taken to be a Gaussian (this is a good approximation for the intensity distribution in the source image):

$$\Psi_0(G)=P(G)=\exp[-\tfrac{1}{2}(G/q_0)^2](q_0^2 2\pi)^{-1/2}$$

The RMS (Root Mean Square) width is $q_0$. This parameter $q_0$ is related to the usual coherence angle $\alpha$ via the relationship $\alpha=\lambda q_0$. In the expression for the image intensity I(G), one now has to convolute the exponentials with P(G) instead of $\delta(G)$:

$$\int dq\,\exp[2\pi i\chi(G+q)]P(q)=$$

$$\int dq\,\exp[2\pi i\{1/2\lambda F\{G+q\}^2+1/4\lambda^3 C_S\{G+q\}^4\}]\cdot\exp[-1/2(q/q_0)^2]$$

$$(q_0^2 2\pi)^{-1/2}=$$

$$\int dq\exp[2\pi i(1/2\lambda F\{G^2+2Gq+\ldots\}+1/4\lambda^3 C_S\{G^4+4G^3 q+\ldots\})]\cdot$$

$$\exp[-1/2(q/q_0)^2](q_0^2 2\pi)^{-1/2}\cong$$

$$\exp[2\pi i(1/2\lambda FG^2+1/4\lambda^3 C_S G^4]\cdot$$

-continued $$\int dq \exp[2\pi i(\lambda FGq + \lambda^3 C_S G^3 q) - 1/2(q/q_0)^2](q_0^2 2\pi)^{-1/2} =$$

$$\exp[2\pi i \chi(G)]\exp[-2\pi^2 q_0^2(\lambda FG + \lambda^3 C_S G^3)^2]$$

The integration shows that the finite convergence angle dampens the contrast transfer functions by the so-called "spatial coherence damping envelope function":

$$E_S(G) = \exp[-2\pi^2 q_0^2(\lambda FG + \lambda^3 C_S G^3)^2] \text{ or}$$

$$E_S(G) = \exp[-2\pi^2 \alpha^2(FG + \lambda^2 C_S G^3)^2]$$

or, more generally:

$$E_S(G) = \exp[-2\pi^2 q_0^2 |\nabla \chi|^2]$$

where $\nabla \chi$ is the derivative (Laplacian) of $\chi$ with respect to G.

Figure 4:
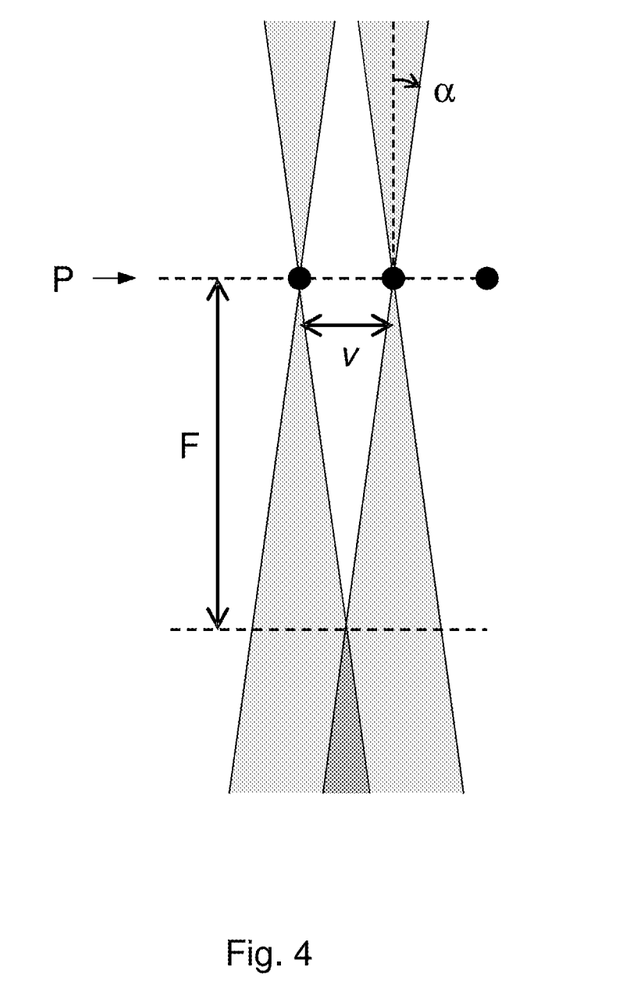
FIG. 4 illustrates a relationship between coherence angle (of an impinging beam), defocus and resolution loss.

In the absence of spherical aberration and other aberrations, this envelope is approximately one for small $\alpha$, and roughly starts to drop to zero when $\alpha > 1/(F G)$. This relation can be understood from the illustration in FIG. 4, which shows that beams (impinging on atoms of a specimen P) spaced by a lateral distance $v = |v| = 1/G$ start to overlap at a defocus $F = v/\alpha$, so that resolution loss occurs at $\alpha > v/F = 1/(F G)$.

Spatial Coherence Damping Envelope with Inventive Aperture

If the inventive aperture is placed at/near the plane of the source image, then $P(G)$ will have, on top of the Gaussian distribution, sub-ranges in which $P(G)$ equals zero:

$$P(G) = A(G) \cdot \exp[-\frac{1}{2}(G/q_0)^2](q_0^2 2\pi)^{-1/2}$$

Here, $A(G)$ is a block function (filter function) describing the inventive aperture plate, with $A(G)=1$ at the spatial frequencies corresponding to the holes in the aperture plate, and $A(G)=0$ at the spatial frequencies blocked by the aperture plate.

The aforementioned convolution can no longer be calculated analytically, but one can still express the results in terms of the Fourier transform $P(u)$ of $P(G)$. The derivation goes as follows:

$$\int dq \, \exp[2\pi i(G+q)]P(q) = \int dq \, \exp[2\pi i\{\chi(G) + q\nabla\chi + \ldots\}]P(q) =$$

$$\exp[2\pi i \chi(G)] \int dq \exp[2\pi i q \nabla \chi]P(q) + \ldots = \exp[2\pi i \chi(G)]\mathcal{P}(\nabla \chi) + \ldots$$

The triple dots (• • •) represent higher-order terms in q, which can be neglected. The integration shows that the distribution of convergence angles produced by the inventive aperture dampens the contrast transfer functions by a modified spatial coherence damping envelope function:

$$E_S(G) = \mathcal{P}(\nabla \chi)$$

Figure 5A:
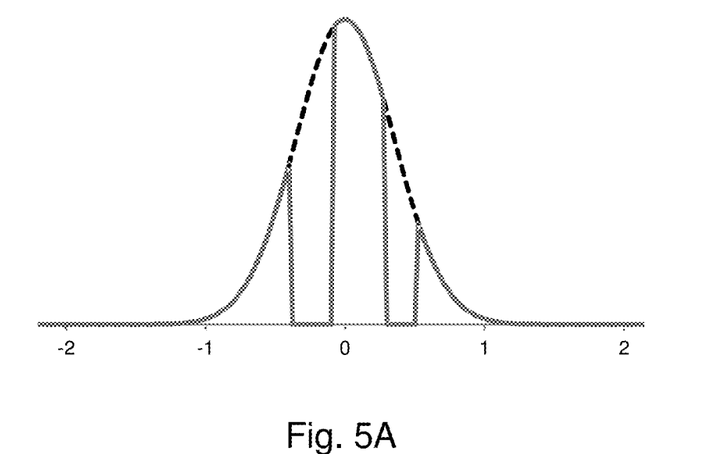
FIGS. 5A and 5B illustrate how the present invention can be used to selectively manipulate a Fourier transform of an image function.
Figure 5B:
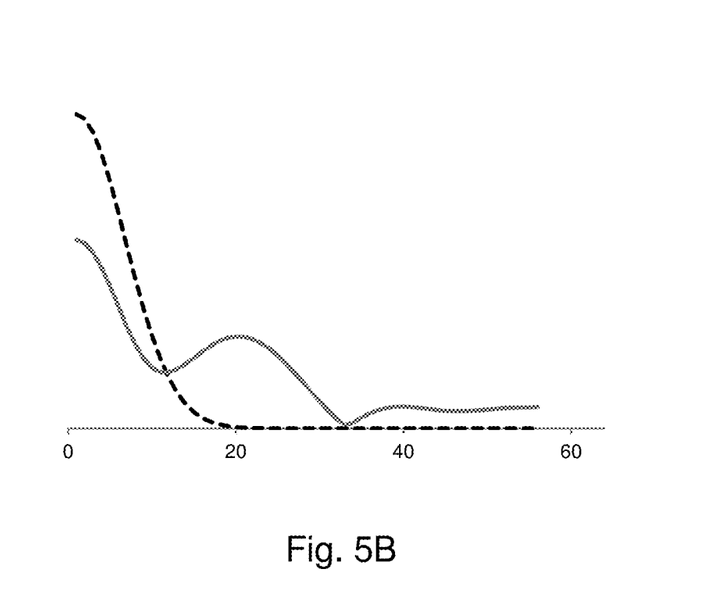

The essential benefit of the inventive aperture is that it brings more higher frequencies to $P(G)$ than is the case for the conventional Gaussian distribution (FIG. 5A). Hence, the Fourier transform $\mathcal{P}(\nabla \chi)$ will be larger at higher frequencies G, as illustrated in FIG. 5B. In this context:

FIG. 5A illustrates a source image $P(G)$ as a function of spatial frequency G for both a conventional aperture (dashed line) and a patterned aperture according to the invention (solid line).

FIG. 5B shows the Fourier transform of $P(G)$ at selected higher frequencies, again for a conventional aperture (dashed line) and a patterned aperture according to the invention (solid line). Note that the latter (solid line) remains significantly above zero long after the former (dashed line) has asymptotically zeroed out.

Thus, $E_S(G)$ with the inventive aperture will give less damping at higher frequencies than the conventional $E_S(G)$. This improves the spatial resolution.

EMBODIMENT 5

Reconstruction Algorithms for a Patterned Aperture

In the following, the imaging process is modeled using a convolution operation, where y is the measured image, h the point spread function kernel and x the unknown 'un-blurred' image:

$$y = h * x \quad (1)$$

In Bayesian terms, one can represent the probability of the sought image x given the known image y as:

$$P(x \mid y) = \exp\left(-\frac{|y - h * x|^2}{\sigma^2}\right) \quad (2)$$

Typically, prior knowledge about the images to be reconstructed is modeled with a term $P(R(x))$ such that:

$$P(x \mid y) = \exp\left(-\frac{|y - h * x|^2}{\sigma^2}\right) \cdot P(R(x)) \quad (3)$$

Often, $R(x)$ is a user-defined function that maximizes the prior probability for a desired intensity distribution. A common choice for $R(x)$ is prior distributions which impose a Gaussian behavior on image gradients with a known statistical deviation $\sigma_x$:

$$R(x) = -\frac{|\nabla x|^2}{\sigma_x^2} \quad (4)$$

The reconstruction process then consists of finding the most likely image x* as follows:

$$x^* = \mathrm{argmin}_x \left\{ \exp\left(-\frac{|y - h * x|^2}{\sigma^2} + R(x)\right) \right\} \quad (5)$$

The iterative solution of (5) can, for example, be found using gradient-descent based techniques, such a quasi-Newton or any other advanced numerical optimization method. It is to be noted that, in (5), one assumes prior knowledge of the kernel h. Such knowledge can be obtained by measurements of point-source responses, from theoretical optical modeling, or from simulations, for example. In case one cannot discern h beforehand, on can alternately solve for both variables x and h in a so-called blind reconstruction problem:

$$x^*, h^* = \mathrm{argmin}_{x,h} \left\{ \exp\left(-\frac{|y - h * x|^2}{\sigma^2} + R(x)\right) \right\} \quad (6)$$

It is also noted that h is dependent on the distance from the imaged object to the inventive patterned aperture (working distance). Measuring the kernel $h_d$ for a given working distance d and then applying the reconstruction algorithm that solves for (5) leads to an image with sharper features for the regions that are located at distance d. The local sharpness itself can be determined from the strength of image edge responses, among other approaches, and the corresponding distance/depth value assigned to it. By measuring $h_d$ for a succession of distances, one can use such a procedure to recover the topography of the entire imaged region.

Additionally, if the kernel h is characterized with high-resolution—e.g. using measurements, theoretical knowledge or simulation—one can recover a super-resolved image from the observed image using compressive sensing techniques. In this task, one represents the convolution imaging process of (1) by a matrix-vector multiplication by serializing x and y while representing the kernel h by the corresponding matrix operator H, leading to:

$$y = D \cdot H \cdot x \quad (7)$$

where D is a down-sampling matrix operator (e.g. sampling every other image pixel). In the well-known compressive sensing approach, the reconstruction task can be cast as a constrained l1-minimization problem:

$$\min_x \|x\|_1 \quad (8)$$

such that y=D.H.x

Various methods can be employed to solve for (8), such as Linear Programming, Basis Pursuit De-noising, Orthogonal Matching Pursuit and Iterated Hard Thresholding, for example.

The invention claimed is:

1. A Charged Particle Microscope, comprising:
a specimen holder, for holding a specimen;
a source, for producing a beam of charged particles;
an illuminator, for directing said beam so as to irradiate the specimen;
a detector, for detecting a flux of radiation emanating from the specimen in response to said irradiation, the flux defining image data, the image data including a contribution from the sample and a contribution from the optical system; and
a controller for deconvolving the image data to determine the contribution from the sample, thereby allowing removal of the contribution of the optical system from an image of a sample;
which illuminator comprises:
an aperture plate comprising an aperture region in a path of said beam, for defining a geometry of the beam prior to its impingement upon said specimen,
said aperture region comprising a distribution of a plurality of holes, each of which is smaller than a diameter of the beam incident on the aperture plate, the aperture positioned such that none of the plurality of holes is positioned upon the particle optical axis, wherein the distribution of the plurality of holes demonstrates non-isometry relative to a barycenter thereof.

2. A microscope according to claim 1, wherein, within said plurality of holes, there are at least two holes that are mutually different as regards a property selected from the group consisting of hole size, hole shape, hole orientation, and combinations hereof.

3. A microscope according to claim 1, wherein said aperture plate is held by an exchanger mechanism that can be selectively invoked to place a variety of different aperture plates in said beam path.

4. A microscope according to claim 3, wherein said exchanger mechanism is selected from the group consisting of:
a tray comprising a number of holder positions, each of which can be provided with an aperture plate, which tray can be moved so as to position different holder positions in said beam path; and
a gripper that cooperates with a library of aperture plates, the gripper capable of extracting a given aperture plate from said library and positioning it in said beam path.

5. A microscope according to claim 3, wherein said exchanger mechanism is provided with a collection of aperture plates, each of which comprises a different embodiment of said distribution.

6. A method of using a Charged Particle Microscope, comprising the following steps:
providing a specimen on a specimen holder;
directing a beam of charged particles from a source through an illuminator so as to irradiate the specimen;
disposing an aperture plate comprising an aperture region in a path of the beam, to define a geometry of the beam prior to its impingement upon the specimen,
using a detector to detect a flux of radiation emanating from the specimen in response to said irradiation, the flux defining image data, the image data including a contribution from the sample and a contribution from the optical system;
said aperture region comprising a distribution of a plurality of holes, each of which is smaller than a diameter of the beam incident on the aperture plate, the aperture positioned such that none of the plurality of holes is positioned upon the particle optical axis, wherein the distribution of a plurality of holes demonstrates non-isometry relative to a barycenter thereof; and
deconvolving the image data to determine the contribution from the sample, thereby allowing removal of the contribution of the optical system from an image of a sample.

7. A method according to claim 6, wherein said aperture plate is used to perform an autofocus operation for the beam on the specimen.

8. A method according to claim 7, wherein said aperture plate is used during a scanning motion of the beam across at least a portion of the specimen to perform an operation selected from the group consisting of:
estimating a topographical profile for a surface of said portion impinged upon by the beam;
producing an image of said portion that has an essentially uniform focus state for all points therein.

9. A method according to claim 6, wherein said aperture plate is used to improve resolution of an image of the specimen.

10. A method according to claim 9, wherein:
scanning motion of the beam is used to perform a sparse scan of the specimen;
said image is constructed from detector data collected during said sparse scan.

11. A method according to claim 6, wherein:
said microscope is a transmission-type microscope, comprising an imaging system for directing a flux of charged particles transmitted through the specimen onto a detector;
said aperture plate is used to measure image focus.

12. A method for using an aperture plate in a charged particle microscope, comprising:
providing a specimen on a specimen holder;
directing a beam of charged particles from a source through an illuminator so as to irradiate the specimen;
positioning an aperture plate in the path of the beam, said plate having a plurality of holes, each of which is smaller than a diameter of the beam incident on the aperture plate, the aperture positioned such that none of the plurality of holes is positioned upon the particle optical axis, wherein the distribution of a plurality of holes demonstrates non-isometry relative to a barycenter thereof;
detecting radiation resulting from the interaction of the charged particle beam and the specimen;
forming an image of the specimen using information from the detected radiation, said image having convoluted specimen-related information and particle optics-related information; and
mathematically deconvoluting the specimen-related information and particle optics-related information from the image.

13. The method of claim 12, wherein the plurality of holes divide the incident beam into a plurality of emergent sub-beams.

14. The method of claim 13, wherein a defocus is applied to a charged particle beam incident on the specimen.

15. The method of claim 12, wherein positioning an aperture plate comprises positioning an aperture plate in or proximal to a beam crossover within said illuminator.

16. The method of claim 12, wherein the particle optics-related information comprises one or more of magnitude or sign of the distance, along the optical axis, from the specimen at which the beam converges.

17. The method of claim 12, wherein the specimen-related information comprises topographical information.

18. The charged particle microscope of claim 1, wherein said illuminator comprises a beam cross-over and said aperture plate is positioned at or proximal to the beam cross-over.

19. The method of claim 12, further comprising determining one or more of: the number, size, shape, orientation, or distribution of the plurality of holes in said aperture region of said aperture plate to manipulate one or more of: the point-spread function, the Fourier spectrum, the contrast transfer function or imaging function.

20. The method of claim 7 wherein using the aperture plate to perform an autofocus operation for the beam on the specimen comprises adjusting the strength of a lens to adjust the distance from the lens along the optical axis where the beam converges to converge the beam at the specimen.

* * * * *